(12) United States Patent
Ide et al.

(10) Patent No.: US 11,465,168 B2
(45) Date of Patent: Oct. 11, 2022

(54) LIQUID PROCESSING DEVICE AND LIQUID PROCESSING METHOD

(71) Applicant: Tokyo Electron Limited, Tokyo (JP)

(72) Inventors: Hiroyuki Ide, Koshi (JP); Hideo Shite, Koshi (JP); Kousuke Yoshihara, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/040,206

(22) PCT Filed: Mar. 20, 2019

(86) PCT No.: PCT/JP2019/011799
§ 371 (c)(1),
(2) Date: Sep. 22, 2020

(87) PCT Pub. No.: WO2019/182036
PCT Pub. Date: Sep. 26, 2019

(65) Prior Publication Data
US 2021/0008588 A1    Jan. 14, 2021

(30) Foreign Application Priority Data

Mar. 23, 2018    (JP) .............................. JP2018-056684

(51) Int. Cl.
*B05C 11/10*    (2006.01)
*B05D 1/26*    (2006.01)
(Continued)

(52) U.S. Cl.
CPC .......... *B05C 11/1002* (2013.01); *B05C 11/02* (2013.01); *B05C 11/08* (2013.01); *B05D 1/26* (2013.01); *H01L 21/027* (2013.01)

(58) Field of Classification Search
USPC .......................... 118/52, 612, 683, 692, 712
See application file for complete search history.

(56) References Cited

U.S. PATENT DOCUMENTS 9,846,363 B2 *  12/2017  Yoshihara ......... H01L 21/67017

FOREIGN PATENT DOCUMENTS

| JP | 2000-027813 A | 1/2000 |
| JP | 2005-230691 A | 9/2005 |

(Continued)

OTHER PUBLICATIONS

International Search Report of PCT/JP2019/011799 dated Jun. 11, 2019.

*Primary Examiner* — Yewebdar T Tadesse
(74) *Attorney, Agent, or Firm* — Pearne & Gordon LLP

(57) ABSTRACT

A liquid processing device includes: a nozzle configured to discharge, onto a substrate, a processing liquid supplied from a processing liquid source, the processing liquid being configured to process the substrate; a main flow path which connects the processing liquid source and the nozzle; a filter provided in the main flow path; a branch path branched from the main flow path; a pump provided at an end of the branch path; and a controller configured to output a control signal to perform a first process of sucking the processing liquid supplied from the processing liquid source by the pump to flow the processing liquid into the branch path and then a second process of discharging the processing liquid of a smaller amount than a capacity of the branch path from the pump to the branch path to discharge the processing liquid from the nozzle.

11 Claims, 12 Drawing Sheets

(51) Int. Cl.
    *H01L 21/027* (2006.01)
    *B05C 11/02* (2006.01)
    *B05C 11/08* (2006.01)

(56) References Cited

FOREIGN PATENT DOCUMENTS

| | | |
|---|---|---|
| JP | 2007-222703 A | 9/2007 |
| JP | 2011-014732 A | 1/2011 |
| JP | 2014-140001 A | 7/2014 |
| JP | 2014-222756 A | 11/2014 |
| JP | 2016-087548 A | 5/2016 |
| JP | 2018-001082 A | 1/2018 |

* cited by examiner

LIQUID PROCESSING DEVICE AND LIQUID PROCESSING METHOD

CROSS-REFERENCE TO RELATED APPLICATION

This Application is a U.S. national phase application under 35 U.S.C. § 371 of PCT Application No. PCT/JP2019/011799 filed on Mar. 20, 2019, which claims the benefit of Japanese Patent Application No. 2018-056684 filed on Mar. 23, 2018, the entire disclosures of which are incorporated herein by reference.

TECHNICAL FIELD

The various aspects and embodiments described herein pertain generally to a technology of processing a substrate by supplying a processing liquid onto the substrate.

BACKGROUND

In a manufacturing process of a semiconductor device, a liquid processing is performed by supplying a processing liquid to a semiconductor wafer which is a substrate (hereinafter, referred to as "wafer"), and the liquid processing includes a processing for forming a coating film by supplying a coating solution, for example, a resist, to the wafer. A liquid processing device configured to perform the liquid processing is equipped with a pump. Further, the processing liquid reserved in a reservoir is sucked by the pump and pumped to a nozzle. An example of the liquid processing device is described in, for example, Patent Document 1.

The pump is driven to suck and discharge the processing liquid and has a relatively large liquid contact area for sucking and reserving the processing liquid. As a result, particles inside the pump may be mixed as foreign matters into the processing liquid. Patent Document 1 does not describe a method for coping with the problem. Accordingly, there has been a need to suppress the occurrence of abnormality in the processing of the wafer caused by the processing liquid mixed with the foreign matters.

PRIOR ART DOCUMENT

Patent Document 1: Japanese Patent Laid-open Publication No. 2014-140001

SUMMARY

In one exemplary embodiment, a liquid processing device includes: a nozzle configured to discharge, onto a substrate, a processing liquid supplied from a processing liquid source, the processing liquid being configured to process the substrate; a main flow path which connects the processing liquid source and the nozzle; a filter provided in the main flow path; a branch path branched from a branch position in the main flow path; a pump provided at an end of the branch path; and a controller configured to output a control signal to perform a first process of sucking the processing liquid by the pump to flow the processing liquid into the branch path from an upstream side of the branch position in the main flow path and then a second process of discharging the processing liquid of a smaller amount than a capacity of the branch path from the pump to the branch path to discharge the processing liquid from the nozzle.

DETAILED DESCRIPTION

Figure 1:
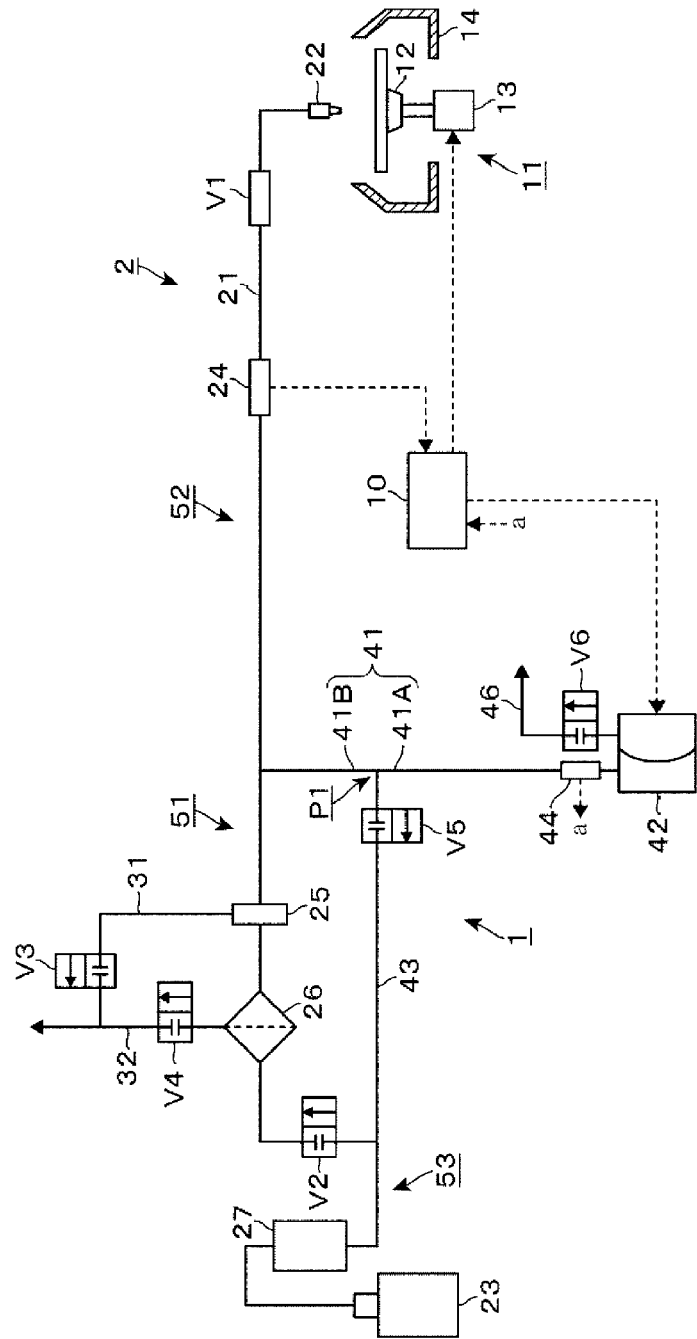
FIG. 1 is a configuration view illustrating a resist coating device according to an exemplary embodiment of the present disclosure.

A resist coating device 1 which is an exemplary embodiment of a liquid processing device will be described with reference to FIG. 1. The resist coating device 1 is a device configured to coat a resist by spin coating and equipped with a wafer placing unit 11 and a resist supply mechanism 2. The wafer placing unit 11 is equipped with a spin chuck 12, a rotation mechanism 13 and a cup 14. The spin chuck 12 serves as a placing unit for a wafer W, and is configured to suck and horizontally hold a center of a rear surface of the wafer W. The rotation mechanism 13 is configured to rotate the wafer W via the spin chuck 12. The cup 14 surrounds the wafer W held by the spin chuck 12 to suppress scattering of the resist from the wafer W during the spin coating.

Hereinafter, the resist supply mechanism 2 will be described. The resist supply mechanism 2 is equipped with a resist supply line 21, a nozzle 22 connected to a downstream end of the resist supply line 21 and a bottle 23 connected to an upstream end of the resist supply line 21. The nozzle 22 is configured to supply the resist to a central portion of the wafer W. The resist is reserved in the bottle 23. Although not illustrated in the drawing, a pressing mechanism configured to press the inside of the bottle 23 and thus allow the resist in the bottle 23 to flow toward a downstream side of the resist supply line 21 is provided.

The resist supply line 21 is equipped with a supply control valve V1, a flowmeter 24, a trap tank 25, a filter 26, a valve V2 and a buffer tank 27 which are arranged in this sequence. The flowmeter 24 as a second flow rate detector transmits, to a controller 10 which will be described later, a detection signal corresponding to a flow rate of the resist flowing through a portion where the flowmeter 24 is provided in the resist supply line 21. The trap tank 25 and the filter 26 are connected to one ends of lines 31 and 32 in which valves V3 and V4 are arranged, respectively. The other end of the line 31 is connected to the other end side relative to the valve V4 in the line 32, and the other end of the line 32 is connected to a drain (drain path) of a factory. With this configuration, air bubbles trapped in the trap tank 25 and the filter 26 can be discharged. The buffer tank 27 is a tank configured to temporarily reserve the resist and serves as a resist source together with the bottle 23.

In the resist supply line 21, a line 41 is branched from a position between the trap tank 25 and the flowmeter 24. An end of the line 41 is connected to a liquid suction/discharge port configured to suck and discharge a liquid in a pump 42 provided in the resist coating device 1. Further, a line 43 is branched from the line 41, and an end of the line 43 is connected to a position between the valve V2 and the buffer tank 27 via a valve V5. The line 41 is configured to allow the resist to flow in the resist supply line 21 and will be hereinafter referred to as "liquid driving line 41". The line 43 is configured to allow the resist flowing into the liquid driving line 41 to return to the buffer tank 27 and will be hereinafter referred to as "return line 43".

As described above, the lines are connected to each other, and, thus, a part of the resist supply line 21, a part of the liquid driving line 41 and the return line 43 form a circulation path 51 for the resist. A downstream side of the resist supply line 21 forms a first connection flow path 52 which is branched from a first position of the circulation path 51 and connected to the nozzle 22. Also, an upstream side of the resist supply line 21 forms a second connection flow path 53 which is branched from a second position different from the first position of the circulation path 51 in a circulation direction of the resist and connected to the bottle 23. A main flow path is formed by the circulation path 51, the first connection flow path 52 and the second connection flow path 53. Further, a part of the liquid driving line 41 on the side of the pump 42 forms a branch line branched from a third position different from the first and second positions of the circulation path 51 in the circulation direction of the resist. Hereinafter, the corresponding part will be referred to as "branch line 41A" for convenience of explanation, and the inside thereof is configured as a branch line branched from the main flow path. Furthermore, a part of the liquid driving line 41 forming the circulation path 51 will be referred to as "circulation path forming line 41B".

A flowmeter 44 serving as a first flow rate detector is arranged in the branch line 41A and transmits, to the controller 10 which will be described later, a detection signal corresponding to a flow rate of a resist flowing through a portion where the flowmeter 44 is provided in the branch line 41A. The flowmeter 44 is provided to determine whether an abnormality occurs in a resist discharged from the pump 42, but as will be described in detail later, the resist discharged from the pump 42 to the liquid driving line 41 does not reach the circulation path forming line 41B. Therefore, the flowmeter 44 is provided in the branch line 41A as described above. More specifically, the flowmeter 44 is provided in front of, i.e., adjacent to, the liquid suction/discharge port of the pump 42. Therefore, the flowmeter 44 is provided at a position closer to the pump 42 than the position where the return line 43 is connected.

Also, the pump 42 is equipped with a drain port for draining the liquid from the pump 42, and the drain port is connected to one end of a drain line 46. The other end of the drain line 46 is connected to the drain of the factory, and a valve V6 is arranged in the drain line 46. The pump 42 may discharge the sucked resist to any one of the liquid suction/discharge port and the drain port. That is, a resist supply destination may be switched between the liquid driving line 41 and the drain line 46.

Figure 2:
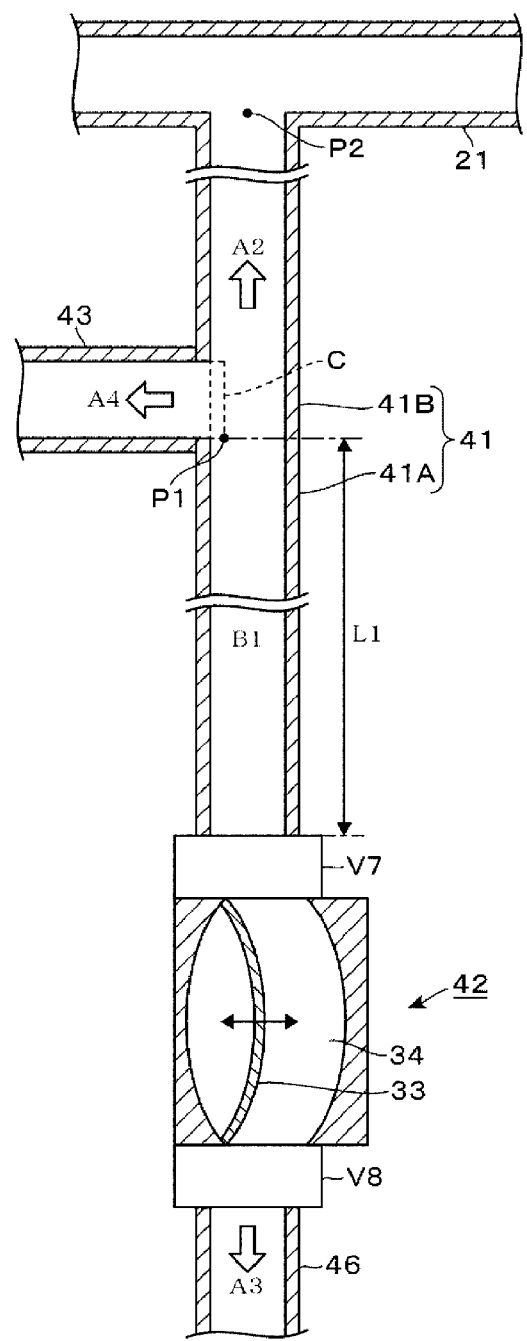
FIG. 2 is a schematic diagram illustrating a pump and lines constituting the resist coating device.

An operation of the resist coating device 1 will be described briefly. As the pump 42 is driven to move the resist between the liquid driving line 41 and the pump 42, the resist is introduced from the resist supply line 21 into the liquid driving line 41 and the introduced resist is pumped to the nozzle 22 through the resist supply line 21. The pump 42 will be described in more detail with reference to FIG. 2. The pump 42 is a diaphragm pump, but may be another kind of pump, such as a tubephragm pump. FIG. 2 schematically illustrates the pump 42 and reference number 33 in the drawing denotes a diaphragm and reference number 34 in the drawing denotes a pump chamber whose capacity is changed as the diaphragm 33 is driven. In the drawing, V7 and V8 denote valves provided in, for example, the liquid suction/discharge port and the drain port, respectively, of the pump 42. That is, in this example, the liquid driving line 41 and the drain line 46 are connected to the pump chamber 34 via the valves V7 and V8, respectively. Based on a control signal from the controller 10 which will be described later, the opening/closing of the valves V7 and V8 and the driving of the diaphragm 33 are controlled and operations of the pump 42 which will be described later are performed.

When a single sheet of wafer W is processed, a liquid suction operation and a subsequent discharge operation of the pump 42 are performed. Therefore, when a plurality of sheets of wafers W is processed, a cycle including the liquid suction operation and the discharge operation is repeatedly performed multiple times. Further, the discharge operation of the pump 42 includes a discharge operation to the line 41 and a discharge operation for draining the resist to the drain line 46. Also, the discharge operation to the line 41 includes a discharge operation for processing by supplying the resist in the line 41 toward the nozzle 22 and a discharge operation for returning by returning the resist to the buffer tank 27 through the return line 43. The reason for performing the discharge operation for draining and the discharge operation for returning will be described later.

An amount of resist sucked by the pump 42 from the liquid driving line 41 in the liquid suction operation is A1 mL. Further, if an amount of resist discharged from the pump 42 to the liquid driving line 41 in the discharge operation for processing is A2 mL, an amount of resist discharged from the pump 42 to the drain line 46 in the discharge operation for draining is A3 mL and an amount of resist discharged from the pump 42 to the line 41 in the discharge operation for returning is A4 mL, A1 mL is set to be equal to A2 mL+A3 mL+A4 mL. For example, A2 is greater than A4 and A4 is greater than A3 (A2>A4>A3). More specifically, for example, A1 is equal to 1.55, A2 is equal to 1.2, A3 is equal to 0.05 and A4 is equal to 0.3.

As described above in the Background section, the pump 42, which is a driving mechanism, is operated, and, thus, the resist flowing into the pump 42 may contain particles. Therefore, the resist coating device 1 is configured so that the resist sucked and reserved in the pump 42 does not flow over the branch line 41A into the circulation path forming line 41B and the return line 43 when the resist is discharged from the pump 42 to the liquid driving line 41. If the position where the return line 43 is connected in the liquid driving line 41 is denoted by P1, the resist reserved in the pump 42 is not moved toward the resist supply line 21 farther than the position P1. Specifically, the position P1 refers to a position closest to the pump 42 in a region C where the return line 43 is connected. Further, being reserved in the pump 42 means passing through a driving member forming a resist flow path provided in the pump 42.

Therefore, if a capacity of the flow path (branch path) formed by the branch line 41A from the position P1 to the valve V7 located closest to the resist supply line 21 in the driving member forming the pump 42 is denoted by B1, the capacity B1 mL is greater than the discharge amount A2 mL in the discharge operation for processing+the discharge amount A4 mL in the discharge operation for returning. With this configuration, it is possible to suppress the inflow of the resist, which may contain the particles, into the circulation path forming line 41B and the return line 43. More specifically, the capacity B1 refers to the capacity of the flow path from the position P1 to the driving member forming the pump 42 on the side of the position P1. Therefore, if the valve V7 is not provided, the capacity B1 is the capacity of the flow path from the position P1 to the diaphragm 33 serving as the driving member.

Further, if B1−(A2+A4) is equal to a mL, as a increases, it is possible to more securely suppress the inflow of the resist, which has flowed into the pump 42, to the circulation path forming line 41B and the return line 43. Therefore, desirably, a mL is, for example, 10 mL or more. Furthermore, as described above, in order to set B1 mL to be greater than A2 mL+A4 mL, it is desirable to increase a length L1 of the branch line 41A. For example, the length L1 of the branch line 41A is 1 m or more. Also, in FIG. 2, a connection position between the liquid driving line 41 and the resist supply line 21 is denoted by P2.

As illustrated in FIG. 1, the resist coating device 1 is equipped with the controller 10 which is a computer. In the controller 10, a program which is stored in a storage such as a compact disk, a hard disk, a MO (magneto-optical) disk, a memory card or a DVD is installed. The installed program incorporates commands (individual processes) so as to transmit control signals to the respective components of the resist coating device 1 to control the operations of the respective components and perform processings which will be described later. Specifically, the program controls a change in the rotation number of the wafer W rotated by the rotation mechanism 13, opening/closing operations of the respective valves V1 to V6 in the lines and operations of the respective components of the pump 42. Further, the controller 10 includes an alarm generation mechanism equipped with a monitor and a speaker to output an alarm as described later based on the detection signals output from the flowmeters 24 and 44. The alarm is, for example, a predetermined screen display or voice.

Figure 3:
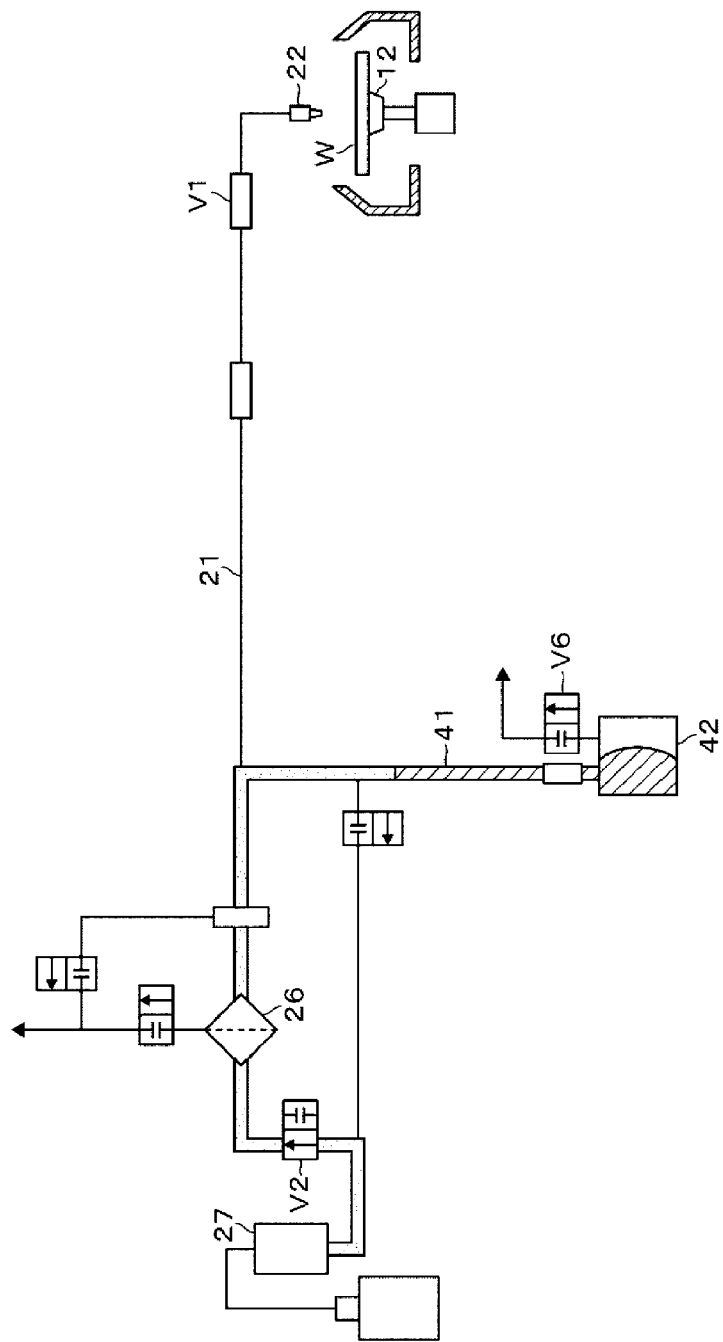
FIG. 3 is an explanatory diagram illustrating opening/closing states of valves and a liquid flow in the resist coating device.

Hereinafter, a processing of the wafer W performed by the resist coating device 1 will be described with reference to FIG. 3 to FIG. 6. In FIG. 3 to FIG. 6, a portion of each line where the resist flows is indicated by a thick line to be distinguished from a portion where the resist does not flow. In FIG. 3, the resist is indicated by different patterns, and the patterns will be described later.

Figure 4:
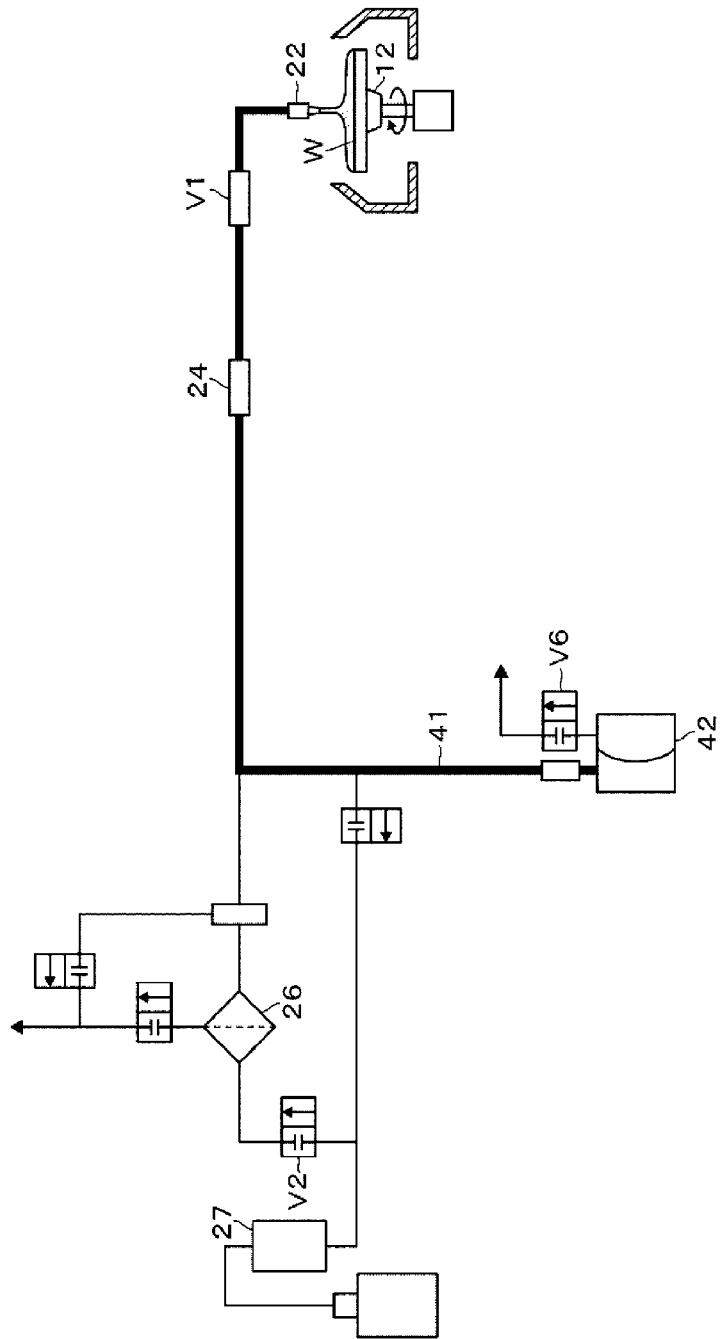
FIG. 4 is an explanatory diagram illustrating opening/closing states of the valves and the liquid flow in the resist coating device.

First, a wafer W is placed on the spin chuck 12. Then, if the valve V2 is opened in a state where the valves V1 to V6 are closed, the pump 42 performs the liquid suction operation. Thus, a resist flows from the buffer tank 27 toward the pump 42 through the liquid driving line 41 (FIG. 3, process S1). Then, the valve V2 is closed and the pump 42 stops the liquid suction operation. Thereafter, the valve V1 is opened and the resist is pumped from the pump 42 to the liquid driving line 41. That is, the pump 42 performs the discharge operation for processing (FIG. 4, process S2). A resist located on the downstream side of the resist supply line 21 relative to the connection position P2 of the liquid driving line 41 is pushed out toward the nozzle 22 by the pumped resist. Then, the spin coating is performed by discharging the resist from the nozzle 22 to the central portion of the wafer W held and rotated by the spin chuck 12, and, thus, a resist film is formed on the wafer W.

While the resist is pumped from the pump 42 to the liquid driving line 41 in the process S2, the controller 10 detects the flow rates of the resist flowing through the portions where the flowmeters 24 and 44 are provided, respectively, based on the detection signals transmitted from the flowmeters 24 and 44. Also, the controller 10 calculates a difference value between the detected flow rate values and determines whether the difference value is within an allowable range. If the difference value is out of the allowable range, the controller 10 determines that the abnormality, such as inclusion of air bubbles in the resist discharged from the nozzle 22, occurs and then outputs the alarm. If the difference value is within the allowable range, the controller 10 determines that no abnormality occurs and does not output the alarm.

Figure 5:
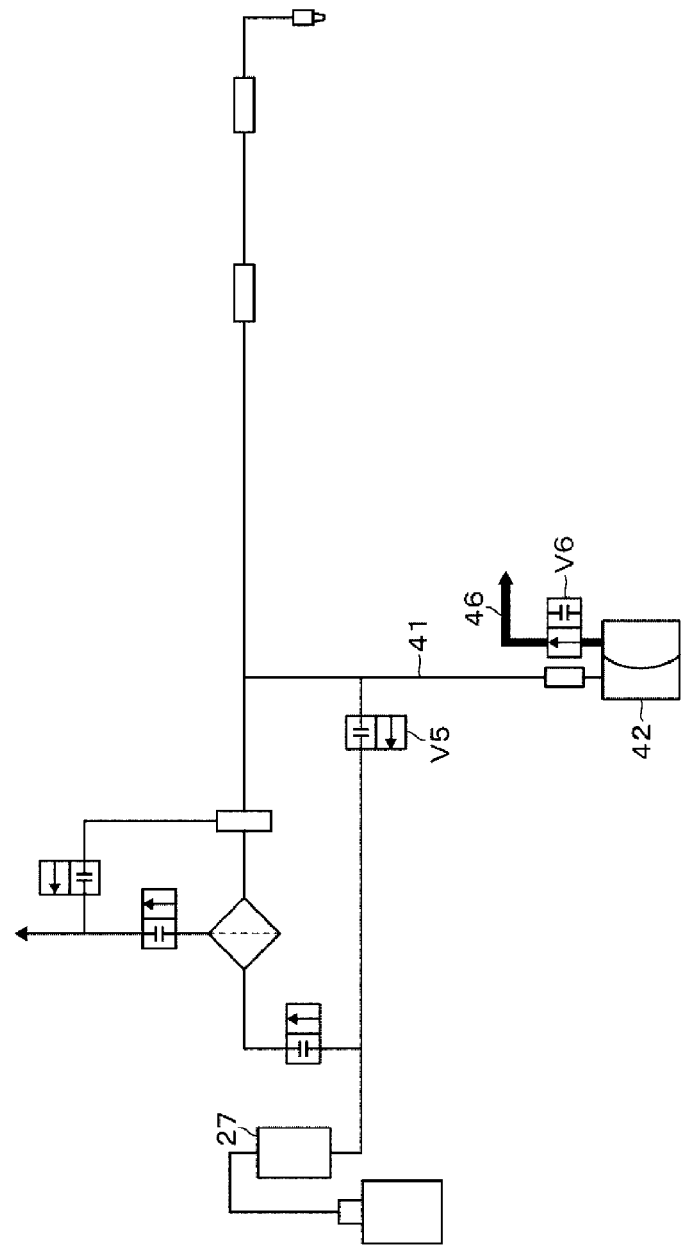
FIG. 5 is an explanatory diagram illustrating opening/closing states of the valves and the liquid flow in the resist coating device.
Figure 6:
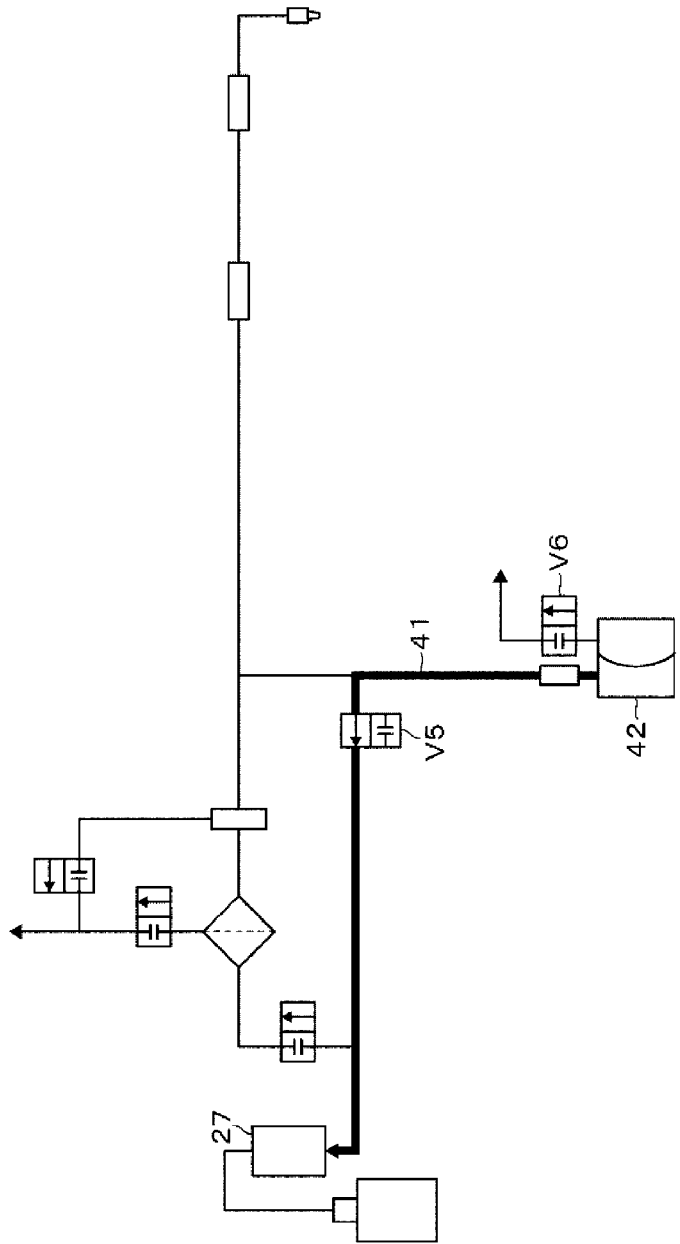
FIG. 6 is an explanatory diagram illustrating opening/closing states of the valves and the liquid flow in the resist coating device.

Then, the valve V1 is closed and the valve V6 is opened, and, thus, a discharge destination of the resist from the pump 42 is switched from the liquid driving line 41 to the drain line 46. Therefore, the resist is drained through the drain line 46. That is, the discharge operation for draining is performed (FIG. 5, process S3). Thereafter, the valve V6 is closed and the valve V5 is opened, and, thus, a discharge destination of the resist from the pump 42 is switched to the liquid driving line 41. Therefore, the resist flows toward the buffer tank 27. That is, the discharge operation for returning is performed (FIG. 6, process S4). Then, instead of the wafer W on which the resist film has been formed, a non-processed wafer W is placed on the spin chuck 12 by a non-illustrated transfer mechanism. Then, a cycle including the processes S1 to S4 is performed to form the resist film on the wafer W. Thereafter, whenever a new wafer W is placed on the spin chuck 12, a processing is performed according to the cycle.

Meanwhile, in the process S4, the resist is returned to the buffer tank 27 located on an upstream side (primary side) of the filter 26. Since the resist is returned as such, a liquid suction amount A1 in the liquid suction operation of the pump 42 is set to be relatively large. Therefore, the amount of resist passing through the filter 26 becomes larger. Accordingly, it is possible to suppress the elution of components of a material forming the filter 26 into the resist since the resist stays long in the filter 26. That is, it is possible to suppress the degeneration of the resist. Also, since the resist is returned to the primary side of the filter 26, the resist repeatedly passes through the filter 26 until the resist heads toward the nozzle 22. Therefore, it is possible to increase the effect of trapping the foreign matters in the resist by the filter 26.

Further, FIG. 3 illustrates a state right before the liquid suction operation of the pump 42 in the process S1 is stopped. Also, in FIG. 3, the resist located on an upstream side of the connection position P2 between the resist supply line 21 and the liquid driving line 41 before the liquid suction operation of the pump 42 is started is indicated by dots and the resist located in the liquid driving line 41 is indicated by hatching. In the resist coating device 1, the resist flows between the branch line 41A forming the liquid driving line 41 and the pump 42 by the operation of the pump 42. If the same resist stays long in the branch line 41A and the pump 42, the resist may degenerate, which may affect the processing of the wafer W. The discharge operation for draining in the process S3 is performed to suppress the stay of the resist.

More specifically, the liquid driving line 41 is configured to have a relatively large capacity in order for the resist discharged from the pump 42 not to flow to the circulation path forming line 41B. Therefore, as illustrated in FIG. 3, the resist which has flowed from the position P2 in the resist supply line 21 into the liquid driving line 41 by one time of the liquid suction operation does not reach the pump 42. However, by performing the discharge operation for draining, the liquid suction amount from the liquid driving line 41 by the pump 42 during a single cycle can be greater than the discharge amount toward the liquid driving line 41. Therefore, as will be described in detail later with reference to the drawings, the resist which has flowed into the liquid driving line 41 moves toward the pump 42 and flows into the pump 42 whenever the cycle is repeated thereafter. Accordingly, it is possible to suppress the stay of the resist in the branch line 41A and the pump 42.

Figure 7:
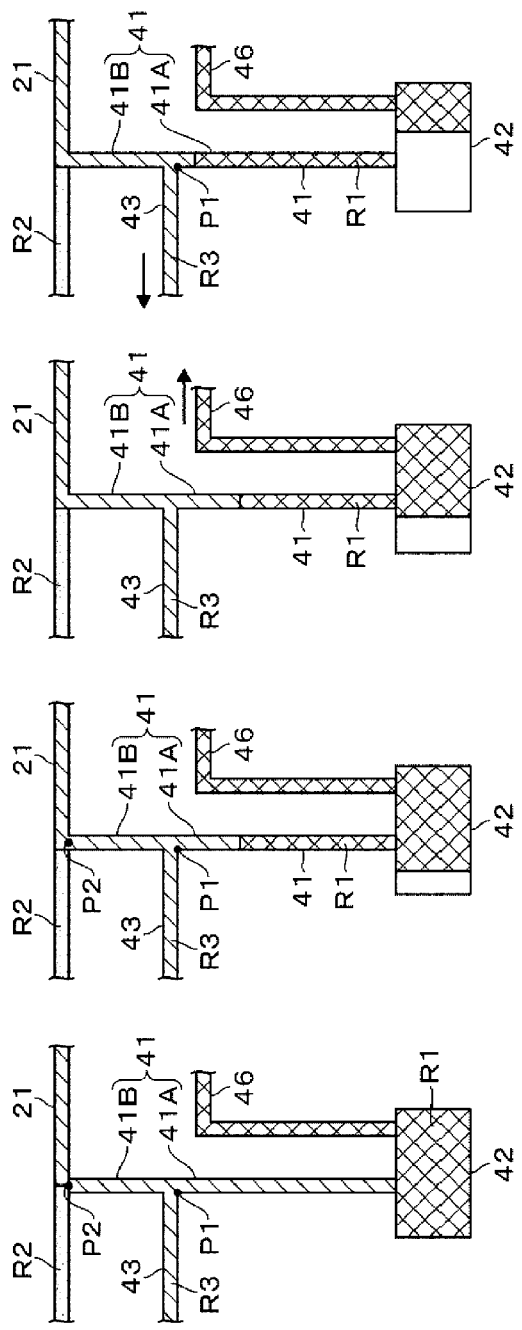
FIG. 7A to FIG. 7D are explanatory diagrams illustrating a state of a resist in the resist coating device.

Hereinafter, the flow of the resist in each line when the cycle is repeatedly performed will be described in detail. FIG. 7A illustrates a state where the liquid suction operation of the process S1 in a certain cycle (N-th cycle for convenience sake, N is a positive integer) is ended and the resist coating device 1 is on standby, and the resist which has flowed into the pump 42, i.e., the resist located inside the pump 42 and the drain line 46, is indicated by a mesh pattern and denoted by R1. Also, the resist on an upstream side of the position P2 in the resist supply line 21 is indicated by dots and denoted by R2. Further, the resist in the liquid driving line 41 and the return line 43 rather than the resists R1 and R2 is indicated by hatching and denoted by R3. Hereinafter, movements of the resists R2 and R3 will be described. Further, the resist flowing into the pump 42 between the resists R2 and R3 while a cycle is being performed is considered as being changed to the resist R1.

The discharge operation for processing of the process S2 is performed from the state shown in FIG. 7A, and, thus, the resist R1 is supplied into the liquid driving line 41. As described above, the resist R1 does not reach the connection position P1 of the return line 43, but stays in the branch line 41A. Further, the resist R3 in the liquid driving line 41 is pushed out by the resist R1 toward a downstream side of the position P2 in the resist supply line 21 (FIG. 7B). Then, the discharge operation for draining of the process S3 (third process) is performed, and, thus, the resist R1 is discharged from the pump 42 (FIG. 7C). Thereafter, the discharge operation for returning of the process S4 (fourth process) is performed, and, thus, the resist R1 is further supplied into the liquid driving line 41 and the resist R3 is supplied into the return line 43 from the branch line 41A forming the liquid driving line 41. As described above, even when the process S4 is performed, the resist R1 does not reach the position P1, but stays in the branch line 41A (FIG. 7D).

Figure 8:
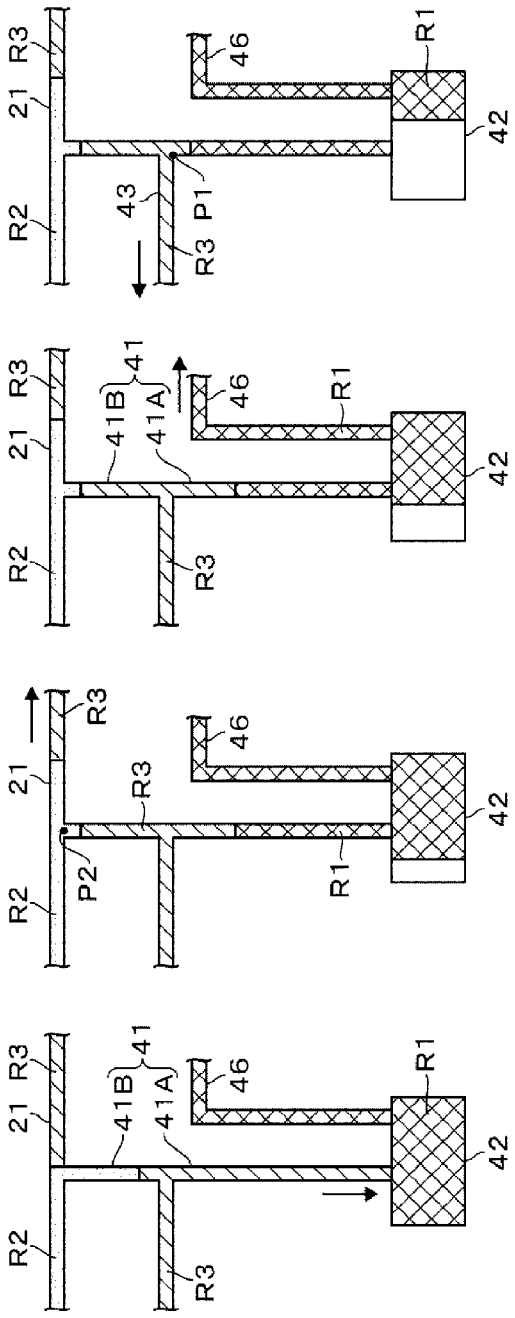
FIG. 8A to FIG. 8D are explanatory diagrams illustrating the state of the resist in the resist coating device.

Then, an (N+1)-th cycle is performed. That is, the liquid suction operation of the process S1 is performed, and, thus, the pump 42 sucks the resists R1 and R3 in the liquid driving line 41 and the resist R2 in the resist supply line 21 is introduced into the liquid driving line 41 (FIG. 8A). Then, the discharge operation for processing of the process S2 is performed, and, thus, the resist R1 is supplied into the branch line 41A and some of the resist R2 introduced into the liquid driving line 41 is pushed out to the downstream side of the position P2 in the resist supply line 21. Further, the resist R3 located on the downstream side of the position P2 is pushed out toward the nozzle 22 (FIG. 8B). Since the liquid suction amount of the pump 42 in the process S1 is smaller than the discharge amount from the pump 42 in the process S2, the resist R2 flows into the liquid driving line 41 when the corresponding discharge operation is ended.

Thereafter, the discharge operation for draining of the process S3 is performed, and, thus, the resist R1 is discharged from the pump 42 (FIG. 8C). Then, the discharge operation for returning of the process S4 is performed, and, thus, the resist R1 is further supplied into the liquid driving line 41 and the resist R3 is supplied into the return line 43. As in the process S4 of the previous cycle, the resist R1 does not reach the position P1 in the process S4 of the present cycle (FIG. 8D).

Figure 9:
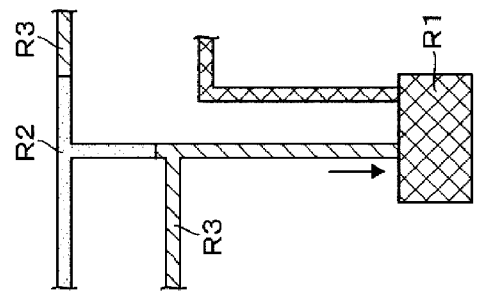
FIG. 9 is an explanatory diagram illustrating the state of the resist in the resist coating device.

Then, an (N+2)-th cycle is performed. That is, the liquid suction operation of the process S1 is performed, and, thus, the pump 42 sucks the resists R1 and R3 in the liquid driving line 41 and the resist R2 in the resist supply line 21 is introduced into the liquid driving line 41 (FIG. 9). The resist R2 which has entered into the liquid driving line 41 before the process S1 is started moves to a position closer to the pump 42 in the liquid driving line 41.

Figure 10:
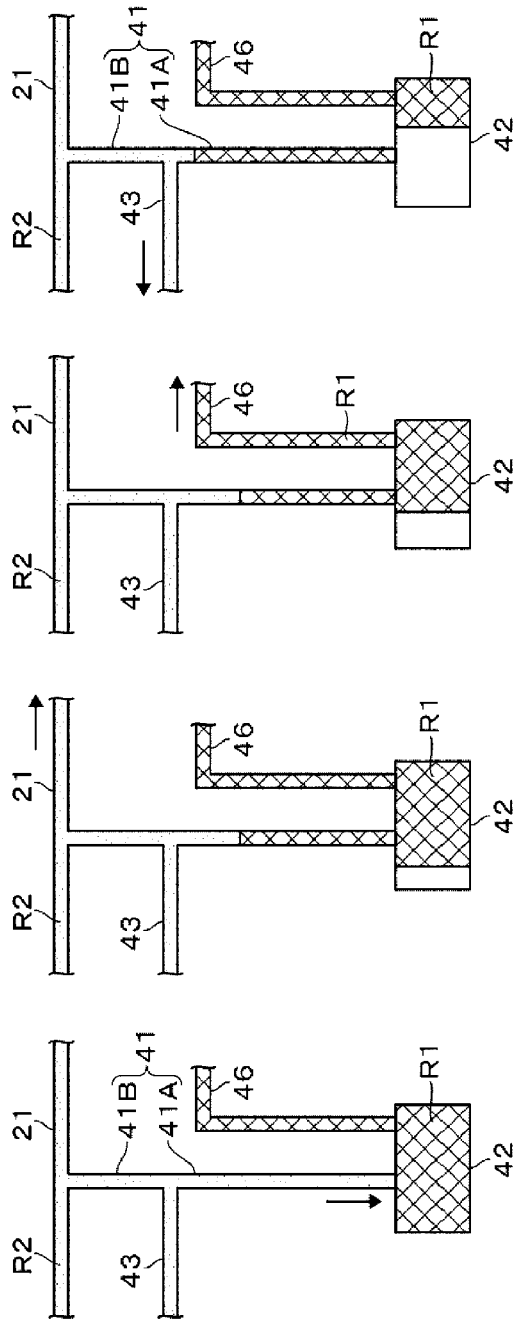
FIG. 10A to FIG. 10D are explanatory diagrams illustrating the state of the resist in the resist coating device.

As such, whenever the cycle is repeated, the resist R2 moves to a position closer to the pump 42 in the liquid driving line 41 and flows into the pump 42, and, thus, the resist in the liquid driving line 41 is gradually changed from R3 to R2. Further, instead of the resist R3, the resist R2 is supplied into the liquid driving line 41, and, thus, the resist supplied from the liquid driving line 41 into the return line 43 is also changed to R2. FIG. 10A illustrates a state where the process S1 of an (N+M)-th cycle is performed when the resists in the liquid driving line 41 and the return line 43 have been changed to R2. Herein, M is a positive integer.

Then, the discharge operation for processing of the process S2 is performed, and, thus, the resist R1 is supplied into the liquid driving line 41 (FIG. 10B). Thereafter, the discharge operation for draining of the process S3 is performed (FIG. 10C) and the discharge operation for returning of the process S4 is performed (FIG. 10D). When the process S4 is ended, the resist R1 stays in the branch line 41A as in the process S4 of another cycle. Although the cycle is repeatedly performed thereafter, the resists R1 and R2 in each cycle are in the states shown in FIG. 10A to FIG. 10D.

According to the resist coating device 1, the pump 42 is provided in the branch line 41A branched from the circulation path 51 provided between the nozzle 22 and the bottle 23 where the resist is reserved. Further, the resist in the resist supply line 21 forming the circulation path 51 is moved by the movement of the resist between the pump 42 and the branch line 41A, and, thus, when the discharge from the nozzle 22 is performed, the discharge amount A2 from the pump 42 to the branch line 41A is smaller than the capacity B1 of the flow path formed by the branch line 41A. With this configuration, the resist, which is supplied from the bottle 23 and passes through the filter 26, does not flow into the pump 42, but is supplied into the nozzle 22. Therefore, the liquid contact area between the resist discharged from the nozzle 22 and the structural component of the device can be suppressed to be relatively small. Further, the resist passing through the filter 26 does not pass other driving members except the valve V1. Therefore, it is possible to suppress the mixing of the foreign matters into the resist. As a result, it is possible to suppress a decrease in yield of semiconductor devices manufactured from the wafer W.

Also, according to the resist coating device 1, the resist supplied to the wafer W does not pass through the branch line 41A and the pump 42. Thus, when cleaning is performed by supplying a cleaning solution into the lines at the time of starting the device and during the maintenance, it is possible to suppress an increase in size of a region in need of the cleaning. As a result, it is possible to reduce the cleaning time and reduce the consumption amount of the cleaning solution to be used.

According to the resist coating device 1, the abnormality is detected based on the flowmeters 24 and 44, but the abnormality may be detected using any one of the flowmeters 24 and 44. That is, when the flow rate measured by the flowmeter 24 or the flowmeter 44 is out of the allowable range, the alarm indicative of the abnormality may be output. Herein, the resist discharged from the pump 42 in the discharge operation for processing as described above stays in the branch line 41A of the liquid driving line 41. Therefore, if only the flowmeter 44 between the flowmeters 24 and 44 is provided, even when the particles from the flowmeter 44 are mixed into the resist, the supply of the particles onto the wafer W can be suppressed.

Desirably, the discharge operation for draining of the process S3 is performed, but it may not be performed. If the discharge operation for draining of the process S3 is not performed, the liquid suction amount A1 in the process S1 is equal to the discharge amount A2 from the pump A2 in the process S2+the discharge amount A4 from the pump 42 in the process S4. If the discharge operation for draining of the process S3 is performed, the liquid suction amount A1 is equal to the discharge amount A2+the discharge amount A3+the discharge amount A4 as described above, and, thus, the liquid suction amount A1 is greater than the discharge amount A2+the discharge amount A4. Therefore, the liquid suction amount A1 is set to be equal to or greater than the sum of the discharge amounts A2 and A4. Further, the number of times of the discharge operation for draining of the process S3 is not limited to one in each cycle, but may be, for example, one in multiple cycles.

Figure 11:
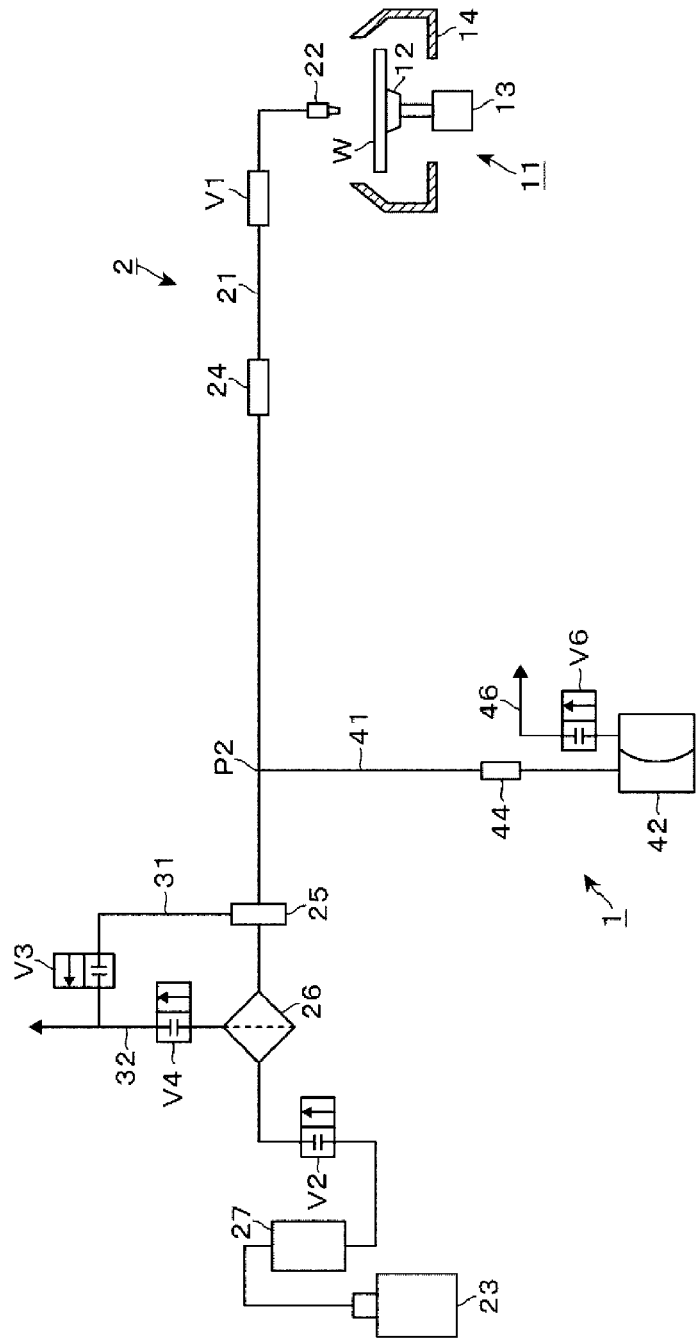
FIG. 11 is an explanatory diagram illustrating another configuration example of the resist coating device.

Further, as illustrated in FIG. 11, the return line 43 may not be provided and the resist coating device 1 may be configured so as not to perform the discharge operation for returning of the process S4. In this case, the capacity of the liquid driving line 41 just needs to be set so that the resist discharged from the pump 42 when the discharge operation for processing is performed does not flow into the resist supply line 21. That is, if the capacity to the position P2 (see FIG. 2) from the pump 42 in the liquid driving line 41 is denoted by B2, the liquid driving line 41 is configured so that the discharge amount A2 from the pump 42 in the process S2+the discharge amount A3 from the pump 42 in the process S3 is smaller than the capacity B2. Further, if the process S4 is not performed, for example, the liquid suction amount A1 of the pump 42 in the process S1 is set to be equal to the discharge amount A2 from the pump 42 in the process S2+the discharge amount A3 from the pump 42 in the process S3.

If the return line 43 is provided and the discharge operation for returning of the process S4 is performed, the liquid suction amount A1 is equal to the discharge amount A2+the discharge amount A3+the discharge amount A4 as described above, and, thus, the liquid suction amount A1 is greater than the discharge amount A2+the discharge amount A3. Therefore, the liquid suction amount A1 is set to be equal to or greater than the sum of the discharge amounts A2 and A3. Further, the number of times of performing the process S4 is not limited to one in each cycle, but may be, for example, one in multiple cycles.

Figure 12:
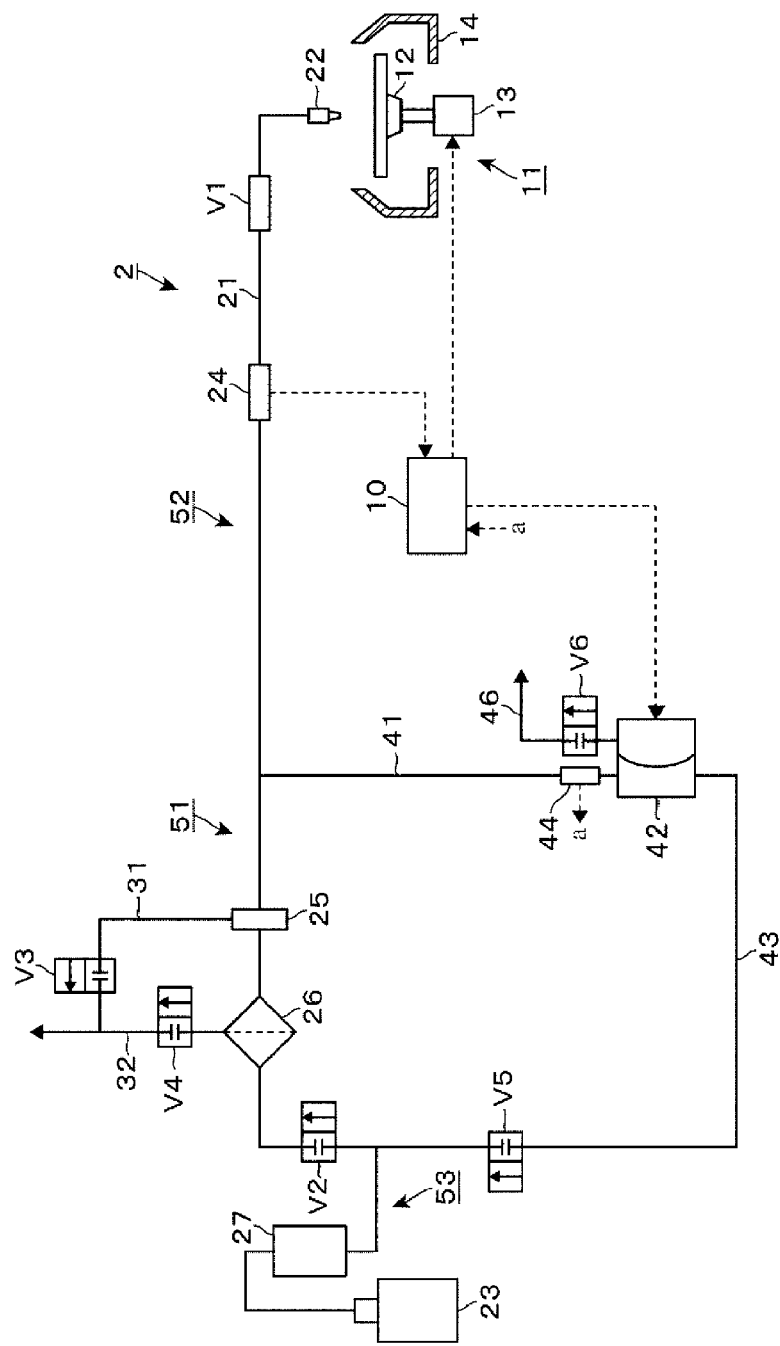
FIG. 12 is an explanatory diagram illustrating another exemplary embodiment.

Further, as illustrated in FIG. 12, the return line 43 may not be branched from the line 41, but may be connected to another liquid suction/discharge port of the pump 42 different from that connected to the line 41. That is, in the circulation path 51, the filter 26 and the pump 42 may be separately provided in respective regions divided by the first position and the second position. In this case compared to the example illustrated in FIG. 1, when the resist is returned from the pump 42 to the primary side of the filter 26, the resist may flow, not through the line branched from the line 41 illustrated in FIG. 1, but through a return line 43 different from the line 41. In other words, when the returning operation of the process S4 is performed, the resist moves from the resist reserved in the pump 42 and flows through a flow path different from that taken for the discharge operation for processing. That is, it is possible to remove the risk of mixing the particles into the liquid to be used for processing and increase the degree of cleanliness by making the resist reserved in the pump 42 repeatedly pass through the filter 26. Since the returning operation is performed for a predetermined time period such as between the processings, the degree of cleanliness of the resist in the entire flow path including the inside of the pump 42 can be maintained.

A capacity of the line from an outlet of the filter 26 to the first position is denoted by C1 and a capacity from the first position to the valve V7 (see FIG. 2) located closest to the resist supply line 21 in the driving members forming the pump 42, i.e., the capacity of the line 41, is denoted by C2. Also, a capacity of the return line 43 is denoted by C3 and a capacity of the line from the second position to an inlet of the filter 26 is denoted by C4. Further, the inlet and the outlet of the filter 26 are connection ports where the filter 26 is connected to lines.

The line from the outlet of the filter 26 to the first position is provided to satisfy C1<A1. Also, the capacity of the line is determined based on the length and the diameter of the line. Thus, the resist liquid, which passes through the filter 26 to be sucked, certainly flows into the line 41 heading from the first position to the pump 42. Therefore, a clean resist which has passed through the filter in the discharge operation for processing can be sent toward the nozzle 22.

Further, the line 41 is provided to satisfy A2<C2<a capacity (hereinafter, referred to as Cp) allowed to be supplemented by the pump 42. Herein, Cp refers to a capacity that can be introduced into the pump 42 to be reserved therein by the liquid suction operation of the pump 42. Since A2 is smaller than C2, the resist liquid reserved in the pump 42 is not allowed to flow into the resist supply line 21 in the discharge operation for processing as shown in FIG. 1, and, thus, it is possible to suppress the generation of particles in the resist used for processing. Since C2 is smaller than Cp, it becomes easier to substitute the resist in the line 41 branched from the resist supply line 21 toward the pump 42 by the liquid suction operation. Therefore, it is possible to suppress the risk of the particle generation caused by the stay not only in the pump 42 but also in the line 41. Also, if C3 is smaller than Cp, the substitution of the resist in the return line 43 whose discharge amount for returning has been controlled can be improved, which is desirable. Further, if C2+A2 is smaller than Cp (C2+A2<Cp) and C3+A2 is smaller than Cp (C3+A2<Cp), the resist in the line 41 or the return line 43 can be substituted even after the discharge operation for processing is performed, which is more desirable. That is, the liquid is supplied from the pump 42 into the return line 43 to substitute all the liquid in the return line 43. In this case, if C3 is smaller than Cp and C3+A2 is smaller than Cp (C3<Cp and C2+A2<Cp) as described above, the liquid still remains in the pump 42, and, thus, the pump 42 does not perform the liquid suction operation but subsequently performs an operation of discharging the liquid from the nozzle 22, which is desirable. Further, if C2+A2 is smaller than Cp (C2+A2<Cp) after the liquid is discharged from the nozzle 22, the pump 42 does not perform the liquid suction operation but may discharge the liquid to substitute all the liquid in the line 41, which is desirable.

The line located from the second position to the inlet of the filter 26 is provided to satisfy C4<A4. For this reason, it is possible to allow the resist to pass through the filter 26 and efficiently collect the particles during the discharge operation for returning. The above-described C1 to C4 and Cp are expressed in the same unit as A1 to A4.

As described above, the example shown in FIG. 12 is different from the examples shown in the other drawings in the flow path through which the resist passes during the discharge operation for returning, and, thus, the other discharge operations for processing and the other discharge operations for draining can be performed identically. Besides, in the example shown in FIG. 12, when the pump 42 performs the liquid suction operation, the liquid is sucked not from the return line 43 but from the line 41. Further, the liquid in the pump 42 is supplied into the return line 43. Furthermore, for example, the liquid suction amount A1 of the pump 42 can be freely set, and the maximum set value of the liquid suction amount A1 is Cp. Moreover, as in the configuration examples shown in FIG. 1 and the like, the liquid suction of the pump 42, the liquid supply into the nozzle 22, the draining from the pump 42 and the liquid supply into the return line 43 may be or may not be repeatedly performed in this sequence. Specifically, the draining from the pump 42 may not be performed, and whenever the liquid suction of the pump 42 and the liquid supply into the nozzle 22 are performed multiple times, the liquid supply into the return line 43 may be performed once.

Further, the position of the filter 26 is not limited to the above-described example, and the filter 26 may be provided, for example, in the return line 43. That is, after the resist is circulated in the circulation path 51 formed by the return line 43, the cycle including the processes S1 to S4 may be performed to discharge the resist onto the wafer W. Furthermore, the filter 26 is provided in the circulation path 51, but not limited thereto and may be provided in the first connection flow path 52 or the second connection flow path 53.

The processing liquid is not limited to the resist and may be another processing liquid to be supplied onto the substrate by the pump. Other processing liquids than the resist may include, for example, a chemical solution for forming an anti-reflection film, a chemical solution for forming an insulating film, a developing solution and an adhesive for bonding substrates. Also, the other processing liquids may include a thinner which can be supplied onto the wafer W before the resist to improve wetting properties for the resist. Further, the above-described exemplary embodiments may be appropriately changed or appropriately combined with each other.

According to the present disclosure, it is possible to suppress the foreign matters from being mixed into the processing liquid to be supplied onto the substrate.

We claim:

1. A liquid processing device, comprising:
   a nozzle configured to discharge, onto a substrate, a processing liquid supplied from a processing liquid source, the processing liquid being configured to process the substrate;
   a main flow path which connects the processing liquid source and the nozzle;
   a filter provided in the main flow path;
   a branch path branched from the main flow path;
   a pump provided at an end of the branch path; and
   a controller configured to output a control signal to perform a first process of sucking the processing liquid supplied from the processing liquid source by the pump to flow the processing liquid into the branch path and then a second process of discharging the processing liquid of a smaller amount than a capacity of the branch path from the pump to the branch path to discharge the processing liquid from the nozzle,
   wherein the main flow path includes a circulation path, a first connection flow path which is branched from a first position of the circulation path and connected to the nozzle and a second connection flow path which is branched from a second position of the circulation path different from the first position of the circulation path in a circulation direction of the processing liquid and connected to the processing liquid source,
   the filter is provided in the circulation path, and
   the branch path is branched from a third position of the circulation path different from the first position and the second position of the circulation path in the circulation direction.

2. The liquid processing device of claim 1,
   wherein
   the filter and the pump are provided in respective regions divided by the first position and the second position in the circulation path.

3. The liquid processing device of claim 2,
   wherein a capacity of a line provided from the filter to the first position is smaller than a liquid suction amount into the pump in the first process.

4. The liquid processing device of claim 2,
   wherein a capacity of a line provided from the first position to the pump is smaller than a capacity allowed to be supplemented by the pump.

5. The liquid processing device of claim 2,
   wherein the controller outputs a control signal to perform a fourth process of discharging the processing liquid from the pump to supply the processing liquid toward a primary side of the filter through the circulation path, and
   a capacity of a line provided from the second position to the filter is smaller than a discharge amount from the pump in the fourth process.

6. The liquid processing device of claim 1,
   wherein the controller outputs a control signal to perform a fourth process of discharging the processing liquid from the pump to supply the processing liquid toward a primary side of the filter through the circulation path, and
   a liquid suction amount into the pump in the first process is equal to or greater than a sum of discharge amounts from the pump in the second process and the fourth process.

7. The liquid processing device of claim 6,
   wherein the controller outputs the control signal to perform the third process and the fourth process, and
   the liquid suction amount into the pump in the first process is equal to a sum of the discharge amounts of the pump in the second process to the fourth process.

8. The liquid processing device of claim 1,
   wherein a second flow rate detector configured to detect a flow rate of the processing liquid in the main flow path is provided in the main flow path, and
   the controller determines whether the abnormality occurs based on the flow rates detected by the first flow rate detector and the second flow rate detector, respectively.

9. A liquid processing device, comprising:
a nozzle configured to discharge, onto a substrate, a processing liquid supplied from a processing liquid source, the processing liquid being configured to process the substrate;
a main flow path which connects the processing liquid source and the nozzle;
a filter provided in the main flow path;
a branch path branched from the main flow path;
a pump provided at an end of the branch path; and
a controller configured to output a control signal to perform a first process of sucking the processing liquid supplied from the processing liquid source by the pump to flow the processing liquid into the branch path and then a second process of discharging the processing liquid of a smaller amount than a capacity of the branch path from the pump to the branch path to discharge the processing liquid from the nozzle,
wherein the pump is connected to a drain path, through which the processing liquid is discharged, provided separately from the branch path,
the controller outputs a control signal to perform a third process of discharging the processing liquid from the pump into the drain path, and
a liquid suction amount into the pump in the first process is equal to or greater than a sum of discharge amounts from the pump in the second process and the third process.

10. A liquid processing device, comprising:
a nozzle configured to discharge, onto a substrate, a processing liquid supplied from a processing liquid source, the processing liquid being configured to process the substrate;
a main flow path which connects the processing liquid source and the nozzle;
a filter provided in the main flow path;
a branch path branched from the main flow path;
a pump provided at an end of the branch path; and
a controller configured to output a control signal to perform a first process of sucking the processing liquid supplied from the processing liquid source by the pump to flow the processing liquid into the branch path and then a second process of discharging the processing liquid of a smaller amount than a capacity of the branch path from the pump to the branch path to discharge the processing liquid from the nozzle,
wherein a first flow rate detector configured to detect a flow rate of the processing liquid in the branch path is provided in the branch path, and
the controller determines whether an abnormality occurs based on the flow rate detected by the first flow rate detector,
wherein the first flow rate detector is provided at a position closer to the pump than to a connection position between the branch path and the main flow path.

11. The liquid processing device of claim 10,
wherein a second flow rate detector configured to detect a flow rate of the processing liquid in the main flow path is provided in the main flow path, and
the controller determines whether the abnormality occurs based on the flow rates detected by the first flow rate detector and the second flow rate detector, respectively.

* * * * *